United States Patent [19]

Leber et al.

[11] Patent Number: 4,694,572
[45] Date of Patent: Sep. 22, 1987

[54] PRINTED POLYMER CIRCUIT BOARD METHOD

[75] Inventors: David C. Leber; Timothy L. Falk, both of Vancouver, Wash.

[73] Assignee: Tektronix, Inc., Beaverton, Oreg.

[21] Appl. No.: 874,265

[22] Filed: Jun. 13, 1986

[51] Int. Cl.$^4$ .............................................. H05K 3/34
[52] U.S. Cl. ....................................... 29/840; 29/846; 174/68.5
[58] Field of Search ................. 29/829, 832, 840, 848, 29/846; 427/96; 156/330; 174/68.5

[56] References Cited

U.S. PATENT DOCUMENTS

| | | | |
|---|---|---|---|
| 3,085,295 | 4/1963 | Pizzino et al. | 29/846 X |
| 4,329,779 | 5/1982 | England | 29/840 |
| 4,402,135 | 9/1983 | Schweingruber et al. | 29/848 X |
| 4,554,033 | 11/1985 | Dery et al. | 29/832 X |
| 4,584,767 | 4/1986 | Gregory | 174/68.5 X |

OTHER PUBLICATIONS

IBM Technical Disclosure Bulletin, vol. 27, No. 5, Oct. 1984, pp. 2937–2938, by E. W. Mace.

*Primary Examiner*—Howard N. Goldberg
*Assistant Examiner*—Carl J. Arbes
*Attorney, Agent, or Firm*—William O. Geny

[57] ABSTRACT

A method of manufacturing printed circuit boards includes injection molding a polymer component which may include a substrate for a printed circuit, forming circuit runs and circuit pads on the substrate with conductive adhesive, placing circuit components onto the circuit pads and curing the conductive adhesive. The adhesive may be silkscreened onto the polymer substrate. This process obviates the need for the large number of expensive manufacturing steps necessary to produce conventional etched fiberglass printed circuit boards.

3 Claims, 3 Drawing Figures

PRINTED POLYMER CIRCUIT BOARD METHOD

BACKGROUND OF THE INVENTION

The following invention relates to a process for making printed circuit boards utilizing injection molded polymer substrate components and silk screening those components with electrically conductive ink and/or adhesive.

Conventional printed circuit boards comprise a substrate formed of fiberglass or epoxy which are cut from sheets in order to fit the circuit board within the confines of the shell or area which is to house it. After the substrate has been cut to the desired dimensions, circuit runs must be etched on the board and circuit components must be attached. Placing circuit runs and pads on fiberglass circuit boards is both time consuming and expensive. Circuit runs must be defined by a photographic process and then must be etched into the board. Next, current runs and pads are formed by a plating process. Solder masking, another step, is used to place solder on the boards at appropriate points without destroying the integrity of the circuit runs. Additionally, the step of cutting the substrates to the desired configuration can add to the overall time required to manufacture the circuit boards and thus add to their cost.

SUMMARY OF THE INVENTION

The present invention provides a method for manufacturing a printed circuit board by injection molding a polymer component and by placing circuit runs and pads on the polymer component with conductive ink/adhesive. The component may be surface inside a housing which may be appropriate for supporting the printed circuit. Electrical circuit paths are then formed, together with electrical contact pads on the injection molded polymer substrate with electrically conductive adhesive. Next, circuit elements may be mounted thereto. The circuit board thus formed may then be cured.

This method greatly reduces the time and expense required for the manufacture of printed circuit boards. Since the polymer substrate is injection molded, it may be formed to fit any convenient shape, size or location within a housing or area where the printed circuit is to be located. The use of electrically conductive adhesive for forming circuit runs, permits the mounting of electrical circuit elements onto circuit pads prior to any curing step. The adhesive may be applied by silkscreening. The curing step is performed only after the board has been completely assembled. Thus, the entire process obviates the need for the photo-etching, plating and solder masking steps which have heretofore been necessary when making fiberglass printed circuit boards.

It is a principal object of this invention to provide an inexpensive method for constructing a printed circuit board.

Yet a further object of this invention is to provide a method for constructing printed circuit boards which may be located on component surfaces of electrical circuit housings.

A still further object of this invention is to provide a method for constructing a printed circuit board that obviates the necessity for a large number of fabrication steps using expensive processes.

The foregoing and other objectives, features and advantages of the present invention will be more readily understood upon consideration of the following detailed description of the invention taken in conjunction with the accompanying drawings.

DETAILED DESCRIPTION OF THE INVENTION

A polymer substrate 10 is formed by injection molding to a desired configuration. The substrate 10 could be any portion or component of a housing which would normally house a printed circuit board. For example, the substrate 10 could be the inner surface of a shell or box, or if desired, it could be a planar component contained within the shell or box.

Figure 1:
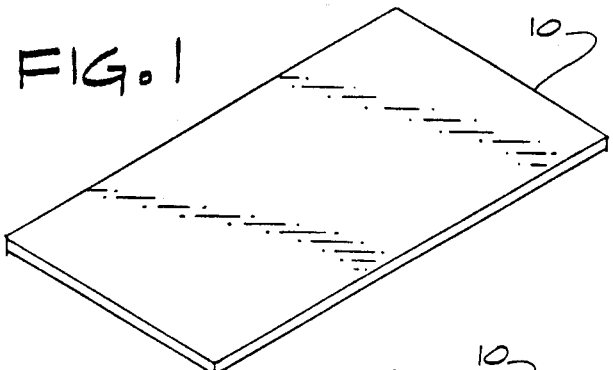
FIG. 1 shows an injection molded polymer substrate.
Figure 2:
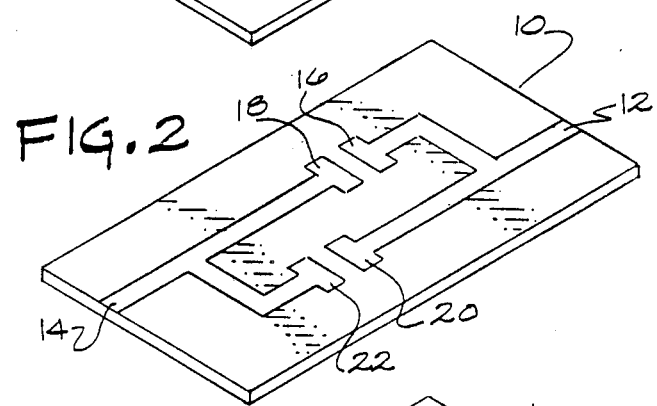
FIG. 2 shows the injection molded polymer substrate of FIG. 1 with circuit runs and circuit pads formed of conductive adhesive placed thereon.
Figure 3:
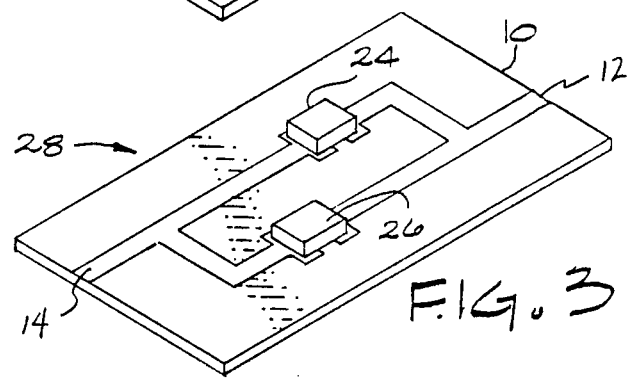
FIG. 3 shows a completed circuit board with the circuit board of FIG. 2 including electrical circuit elements mounted thereon.

Referring to FIG. 2, electrical circuit runs 12 and 14 may be formed on the injection molded polymer substrate 10 by the use of a silk screening process. Electrically conductive adhesive which is suitable for this purpose is available from a number of vendors, an example of which is a conductive adhesive designated 4-1S-5 Advanced Silver Silkscreenable Epoxy Conductive Ink manufactued by Advanced Codings & Chemicals of Temple City, Calif. After the circuit runs 12 and 14 have been silkscreened onto the substrate 10, electrical circuit elements such as integrated circuit chips 24 and 26 may be mounted to the pads 16 and 18, and 20 and 22, respectively. The components, such as 24 and 26, may be mounted to the pads 16, 18, 20 and 22 by placing the components 24 and 26 in a pallet and using a surface mount machine to mount the electrical devices 24 and 26 onto the substrate 10. The adhesive is then cured by placing the printed circuit board thus formed in a temperature-controlled environment for a predetermined period of time.

As an alternative, a conductive ink may be used to form the circuit runs 12 and 14 on the substrate 10. As with the adhesive, silkscreening may be employed. A suitable conductive ink is SS24211 Pad Printable Silver Based Polymer Thick Film Ink manufactured by Acheson Colloids Company of Port Huron, Mich. The ink must then be cured and then conductive adhesive is applied to the circuit pads 16, 18, 20 and 22. Next, circuit components are mounted on the substrate 10, after which the adhesive is cured. The curing step should be conducted in accordance with the instructions of the provider of the conductive adhesive. Curing is performed by placing the entire structure 28 in an oven or similar temperature controlled environment for a predetermined period of time.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

I claim:

1. A method of manufacturing a printed circuit board having electrical circuit elements secured thereto comprising the steps of:
   (a) forming a polymer component, at least a portion of said component comprising a substrate for a printed electrical circuit;
   (b) forming electrical circuit runs and electrical contact pads on said substrate with an electrically conductive, adhesive ink;
   (c) mounting said electrical circuit elements to said electrical contact pads; and
   (d) curing said electrically conductive, adhesive ink with said electrical circuit elements secured thereto.

2. The method of claim 1 wherein step (b) is accomplished through the use of a silkscreening process.

3. The method of claim 1 wherein said polymer components are formed by an injection molding process.

* * * * *